(12) United States Patent
Chen et al.

(10) Patent No.: US 6,521,487 B1
(45) Date of Patent: Feb. 18, 2003

(54) METHOD FOR MAKING A THYRISTOR

(75) Inventors: Yen-Chang Chen, Tai-Nan (TW); Chih-Hung Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/683,248

(22) Filed: Dec. 5, 2001

(51) Int. Cl.[7] ............................................. H01L 21/332
(52) U.S. Cl. .................................................. 438/133
(58) Field of Search .................... 438/268, 133

(56) References Cited

U.S. PATENT DOCUMENTS

| | | | | |
|---|---|---|---|---|
| 5,240,865 A | * | 8/1993 | Malhi | 437/6 |
| 6,110,763 A | * | 8/2000 | Temple | 438/133 |
| 6,316,302 B1 | * | 11/2001 | Cheek et al. | 438/199 |
| 6,331,455 B1 | * | 12/2001 | Rodov et al. | 438/138 |
| 6,338,986 B1 | * | 1/2002 | Kawazoe et al. | 438/133 |
| 6,352,887 B1 | * | 3/2002 | Hutter et al. | 438/202 |
| 6,391,689 B1 | * | 5/2002 | Chen | 438/135 |

* cited by examiner

*Primary Examiner*—Richard Elms
*Assistant Examiner*—Michael K. Luhrs
(74) *Attorney, Agent, or Firm*—Winston Hsu

(57) ABSTRACT

A semiconductor substrate has at least one active area and a STI surrounding the active area. An N-well and an adjacent P-well are formed in the active area. A dummy gate is formed atop the border between the N-well and the P-well, while simultaneously forming gates for other MOS transistors on the semiconductor substrate. A spacer is formed on the periphery of each gate. Finally, an N-type ion implantation process and a P-type ion implantation process are performed to form a cathode and an anode for the silicon controlled rectifier device in the P-well and the N-well between the STI and the dummy gate.

19 Claims, 14 Drawing Sheets

METHOD FOR MAKING A THYRISTOR

BACKGROUND OF INVENTION

1. Field of the Invention

The present invention provides a method for making a thyristor.

2. Description of the Prior Art

Thyristors, also called silicon-controlled-rectifiers (SCR), are a type of semiconductor device having a four-layered, P-N-P-N structure. There are thus three P-N junctions in series in this device. The anode is electrically connected to the outermost P layer, and the cathode is electrically connected to the outermost N layer. A gate electrode is electrically connected to the middle P layer.

When a positive potential is applied to the anode, and a negative potential is applied to the cathode, no current passes through the SCR, since the middle junction is reversed biased. When a sufficiently large positive voltage is applied to the gate, the SCR is turned on. The voltage required to turn on the SCR device is termed a breakover voltage. When an applied voltage reaches the breakover voltage, a current termed a holding current will flow from the cathode to the anode through the P-N junctions. Once turned on, the gate will no longer control the SCR, and current will continue to flow until the circuit is switched off or the external voltage is reduced to zero. Related techniques are disclosed in U.S. Pat. No. 5,225,702, "Silicon Controlled Rectifier Structure For Electrostatic Discharge Protection", and U.S. Pat. No. 5,682,047, "Input-Output (I/O) Structure With Capacitively Triggered Thyristor For Electrostatic Discharge (ESD) Protection".

Since SCR devices have characteristically low holding voltages ($V_{hold}$) they are usually utilized in electrostatic discharge protection circuits (ESD protection circuits) to protect other devices and circuits in integrated circuits from damage incurred from electrostatic discharge. With a low holding voltage, the energy consumption (and hence dissipation) is relatively less than other ESD protection devices in CMOS processes, such as diodes, MOS transistors, bipolar junction transistors (BJT), or field oxide devices. For example, the holding voltage ($V_{hold}$) for a SCR is approximately 1V in 0.5 μm CMOS processes, while the snapback holding voltage (snapback $V_{hold}$) for an NMOS is approximately 10V. Therefore the SCR device can sustain about ten times as much ESD voltage for a same layout area as compared to an NMOS device.

Please refer to FIG. 1 to FIG. 6. FIG. 1 to FIG. 6 are cross-sectional diagrams for making a prior art silicon controlled rectifier 68. As shown in FIG. 1, the prior art SCR is made on a semiconductor wafer 10. The semiconductor wafer 10 comprises a substrate 12. A plurality of shallow trench isolation (STI) structures 14 are disposed in the substrate 12 to define an active area 15 for each device. Since other transistor devices, such as NMOS and PMOS transistors with various threshold voltages, are also disposed on the semiconductor wafer 10, ion implantation processes will be performed first to form an N-well 16 and a P-well 18 for other PMOS transistors (not shown) and NMOS transistors (not shown) respectively, while simultaneously forming an N-well 22 and a P-well 24, which are adjacent to each other, in the substrate 12 of the active area 15. The substrate 12 can be a silicon substrate or a silicon-on-insulator (SOI) substrate.

As shown in FIG. 2, the gates for other transistor devices (not shown) are formed. A gate oxide layer 26 is first formed on the surface of the semiconductor wafer 10 by utilizing a thermal oxidation process. A low pressure chemical vapor deposition (LPCVD) process is then performed in a CVD chamber to deposit a polysilicon layer 28 homogeneously on the semiconductor wafer 10. The process conditions for the LPCVD process utilize silane (SiH4) as a reactive gas with a temperature ranging from 575 to 650° C., and a pressure ranging from 0.3 to 0.6 torr.

Thereafter, a first photoresist layer 29 is coated on the polysilicon layer 28 and a photolithography process is performed to define in the first photoresist layer 29 the locations and dimensions of the gates for the NMOS transistors (not shown) and PMOS transistors (not shown). A dry etching process is then performed to vertically remove the polysilicon layer 28 through the defined pattern until reaching the surface of the semiconductor wafer 10, gates 32 for the NMOS transistors (not shown) and the PMOS transistors (not shown) thus being formed. Finally, the first photoresist layer 29 is removed.

As shown in FIG. 3, a first ion implantation process is performed that utilizes a second photoresist layer 34 and the gates 32 as a mask to form a lightly doped drain (LDD) 36 on either side of each gate 32 of the NMOS transistor (not shown). The second photoresist layer 34 is then removed.

As shown in FIG. 4, a silicon oxide layer 38 is deposited on the surface of the semiconductor wafer 10 by utilizing a chemical vapor deposition (CVD) process. A silicon nitride layer 42 is then deposited on the surface of the semiconductor wafer 10 by utilizing a chemical vapor deposition process. A dry etching process etches the silicon nitride layer 42 downwards, and uses the silicon oxide layer 38 as an etch stop layer. Another dry etching process etches the silicon oxide layer 38 downwards until reaching the surface of the semiconductor wafer 10. A spacer 46 is thereby formed on either side of the gate 32 of the NMOS transistors (not shown) and PMOS transistors (not shown).

As shown in FIG. 5, a third photoresist layer 48 is formed on the surface of the semiconductor wafer 10. The third photoresist layer 48 covers the PMOS transistor (not shown), the N-well 22 in the SCR device 68, a portion of the P-well 24 and the neighboring STI 14, and leaves exposed an area in the P-well 24 adjacent to the neighboring STI 14 and the P-well 18. An ion implantation process is performed with phosphorous (P) ions or arsenic (As) ions as dopants, with a dosage of $10^{15}/cm^2$, in order to form a source/drain (S/D) 51, 52 on either side of the gate 32 of the NMOS transistor to complete the NMOS transistor 54. The ion implantation process simultaneously forms an N-type heavy doping region 56 in the area in the P-well 24 adjacent to the neighboring STI 14 for use as a cathode of the SCR device 68. The third photoresist layer 48 is then removed.

As shown in FIG. 6, a fourth photoresist layer 58 is formed on the surface of the semiconductor wafer 10. The fourth photoresist layer 58 covers the NMOS transistor 54, the P-well 24 in the SCR device 68, the neighboring STI 14 and a portion of the N-well well 22, and leaves exposed an area in the N-well 22 adjacent to the neighboring STI 14 and the N-well 16. An ion implantation process with boron (B) as a dopant, with a dosage of $10^{15}/cm^2$, is performed to form a source/drain (S/D) 61, 62 on either side of the gate 32 of the PMOS transistor to complete the PMOS transistor 64. The ion implantation process simultaneously forms a P-type heavy doping region 66 in the area of the N-well 22 adjacent to the neighboring STI 14 for use as an anode of the SCR device 68, and so completes the SCR device 68. The fourth photoresist layer 58 is removed, and a drive-in process is performed to cause the implanted dopants to distribute to desired doping profiles.

In the manufacturing process for the gate 32 of the NMOS transistor 54 and the PMOS transistor 64, processes such as deposition, photolithography and etching are repetitively utilized, and so some contamination inevitably results. Such contaminants readily adhere to the active area 15 of the SCR device 68 and become charged particles. A similar problem occurs in the manufacturing of the spacer 46. The present invention discloses a simplest process for forming the spacer 46 includes deposition, dry etching, and cleaning processes. Additionally, process modifications are often made for the purpose of adjusting the channel length. This results in additional wet etching or cleaning processes, and so even more charged particles will adhere to the active area 15 of the SCR device 68. Furthermore, after so many process steps, the wafer surface of the active area 15 in the SCR device 68 tends to have charged particles incurred from the destructive nature of the processes. With unwanted charge present adjacent to the border of the N-well 22 and P-well 24, an increased leakage current tends to occur, which leads to early breakdown when the SCR device 68 is operating.

Moreover, in the ion implantation process for the source/drain and the anode/cathode of the SCR device, at least two ion implantation processes are performed by utilizing the STI as a reference when exposing and aligning. This results in an increase of error factor in alignment and exceeds the process margin. However, the accuracy for the site of the anode/cathode of the SCR device directly affects the electrical performance of the SCR device. Thus, further investigation is required for more accurate alignment.

Please refer to FIG. 7, FIG. 7 is the structural schematic diagram of another prior art SCR 70. In the SCR device 70, an N-well 72 and a P-well 74 are not directly adjacent to each other. The portions which were originally adjacent to each other are blocked by a shallow trench isolation 76 in the substrate. Therefore the high leakage current at the border of N-well and P-well is effectively inhibited. However, the STI 76 is a structure with a specific depth, so there is a certain degree of impact on the breakdown mechanism of the SCR device 70 which degrades the electrical performance of the SCR device 70.

It is very important to rid the surface of the active area in the SCR device of charged particles and make the photolithography process less complicated when forming the source/drain. However, electrical performance of the SCR device must not be compromised.

SUMMARY OF INVENTION

It is therefore a primary objective of the claimed invention to provide a method for forming a thyristor to resolve the contamination problem.

In the preferred embodiment of the claimed invention, a semiconductor substrate is first provided. The surface of the semiconductor substrate comprises at least one active area and a shallow trench isolation(STI) surrounding the active area. Then, an N-well and a P-well adjacent to the N-well are formed in the active area. Thereafter, a dummy gate is formed on the border of the N-well and the P-well and a gate for the other transistor is simultaneously formed on the semiconductor substrate A spacer is formed in the periphery of each gate. Finally an N-type ion implantation process and a P-type ion implantation process are performed to form a cathode and an anode of the SCR device in the respective P-well and the N-well between the STI and the dummy gate.

It is an advantage of the present invention that in the process for making the SCR device, a dummy gate is first formed on the surface of the semiconductor wafer on the border of the N-well and the P-well. Then, an ion implantation process for forming a lightly doped drain and a process for spacer is performed. Due to these steps, the wafer surface on the border of the N-well and the P-well in the SCR device is not contaminated by the charged particles. The surface of the semiconductor wafer on the border of the N-well and the P-well is effectively protected from the impact of the process which generates charged particles. Thus, the phenomena of increased leakage current and early breakdown are avoided. When performing the photolithography process for the source/drain ion implantation, the dummy gate between the two STI can be used for self-alignment in the active area of the SCR device. This improves the accuracy of the alignment process.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
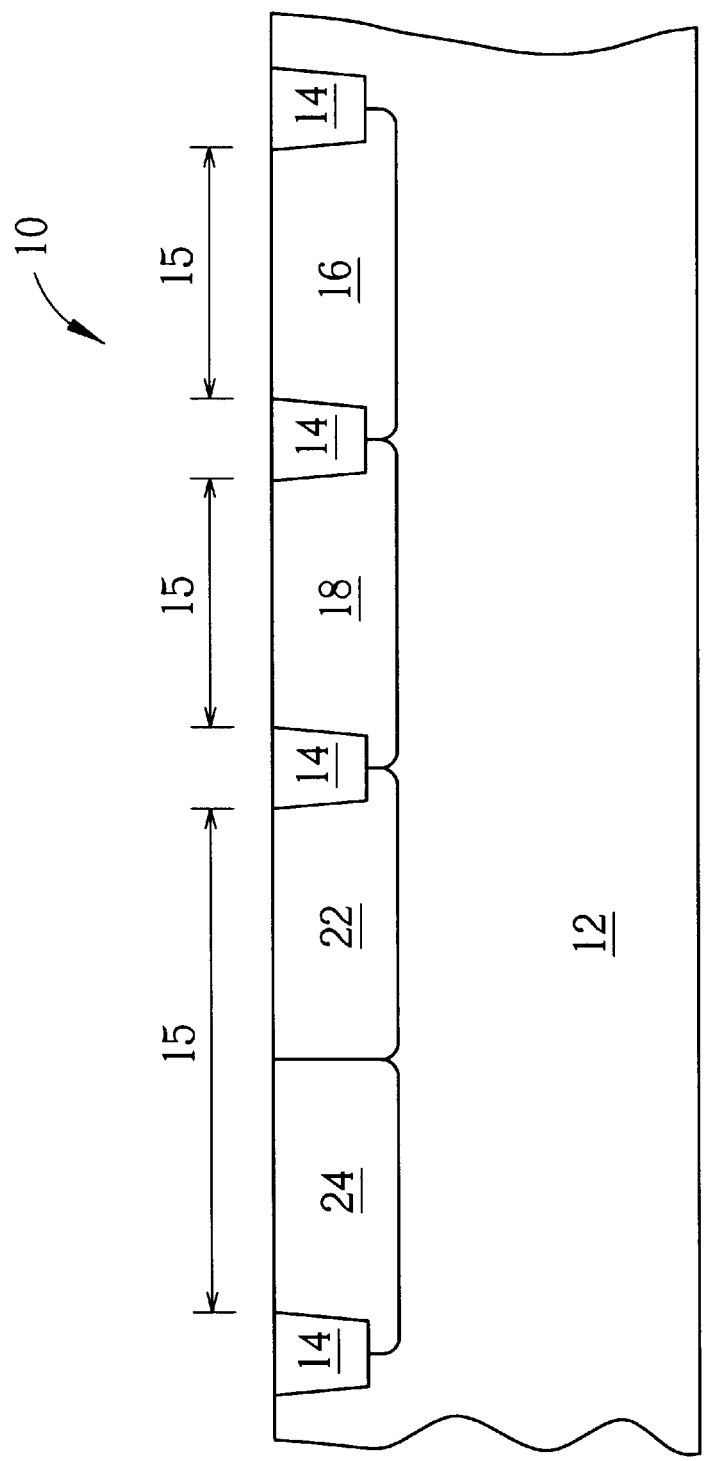
FIG. 1 to FIG. 6 are the cross-sectional diagrams for making a prior art silicon controlled rectifier.
Figure 2:
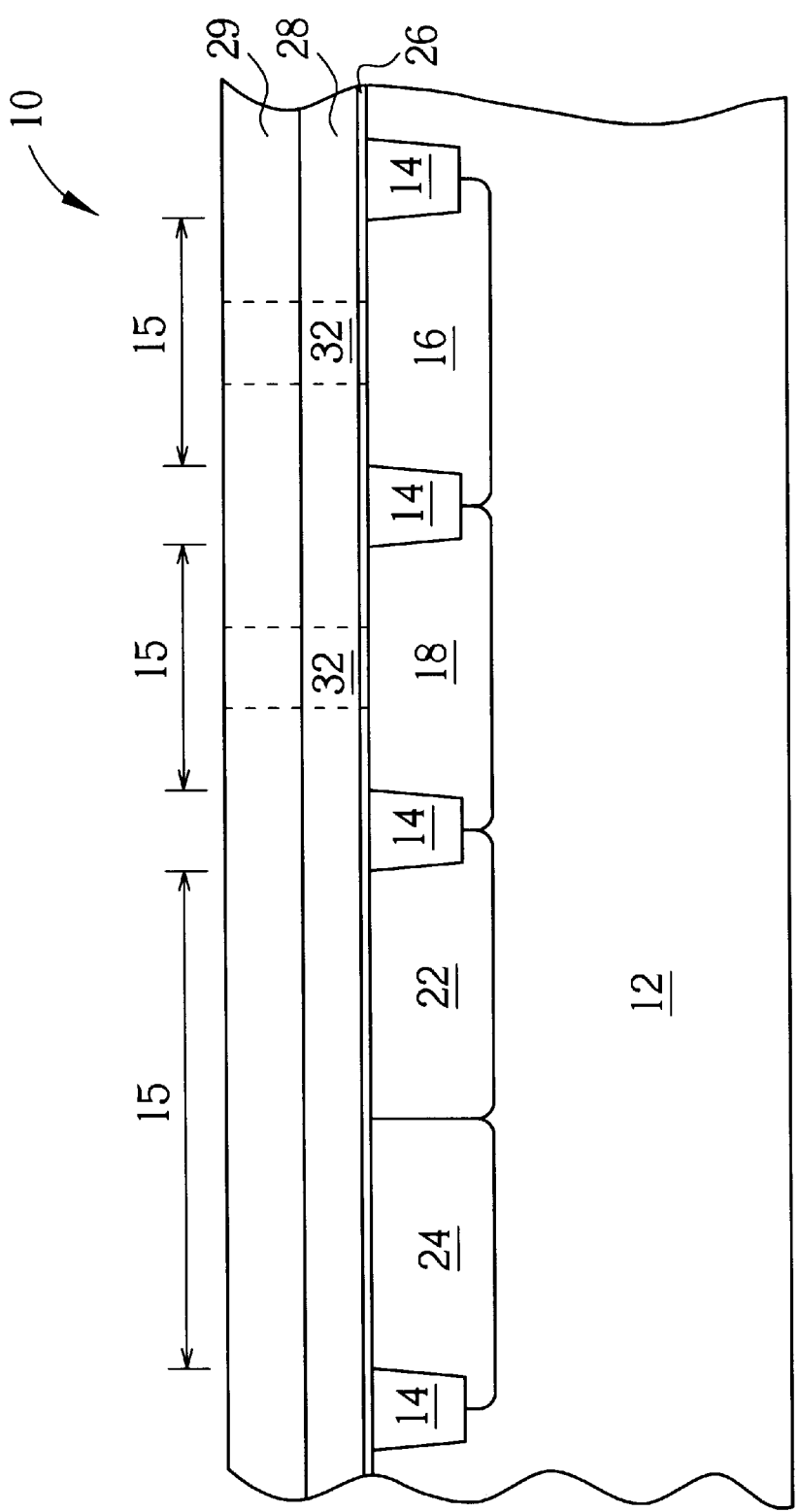
Figure 3:
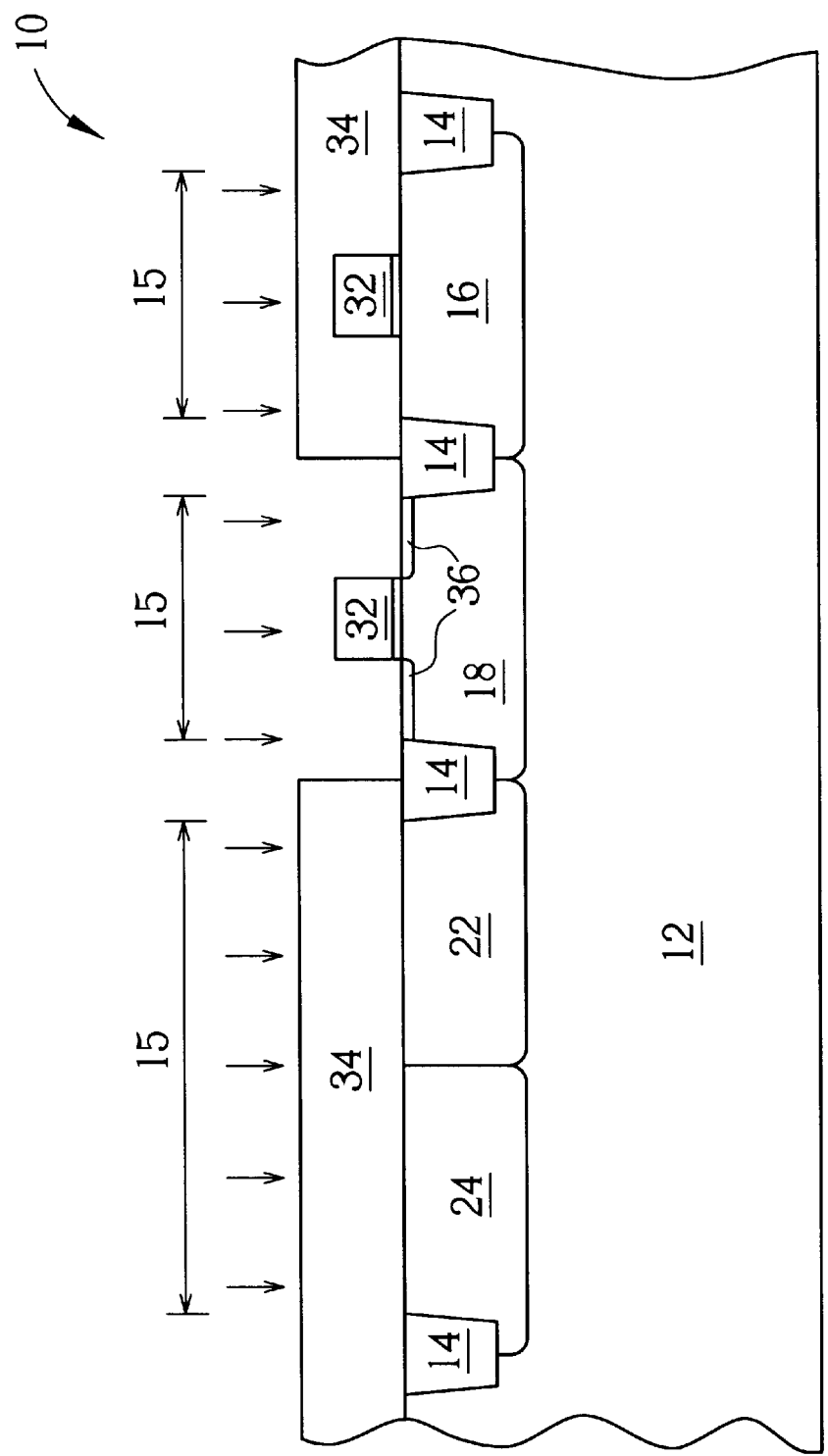
Figure 4:
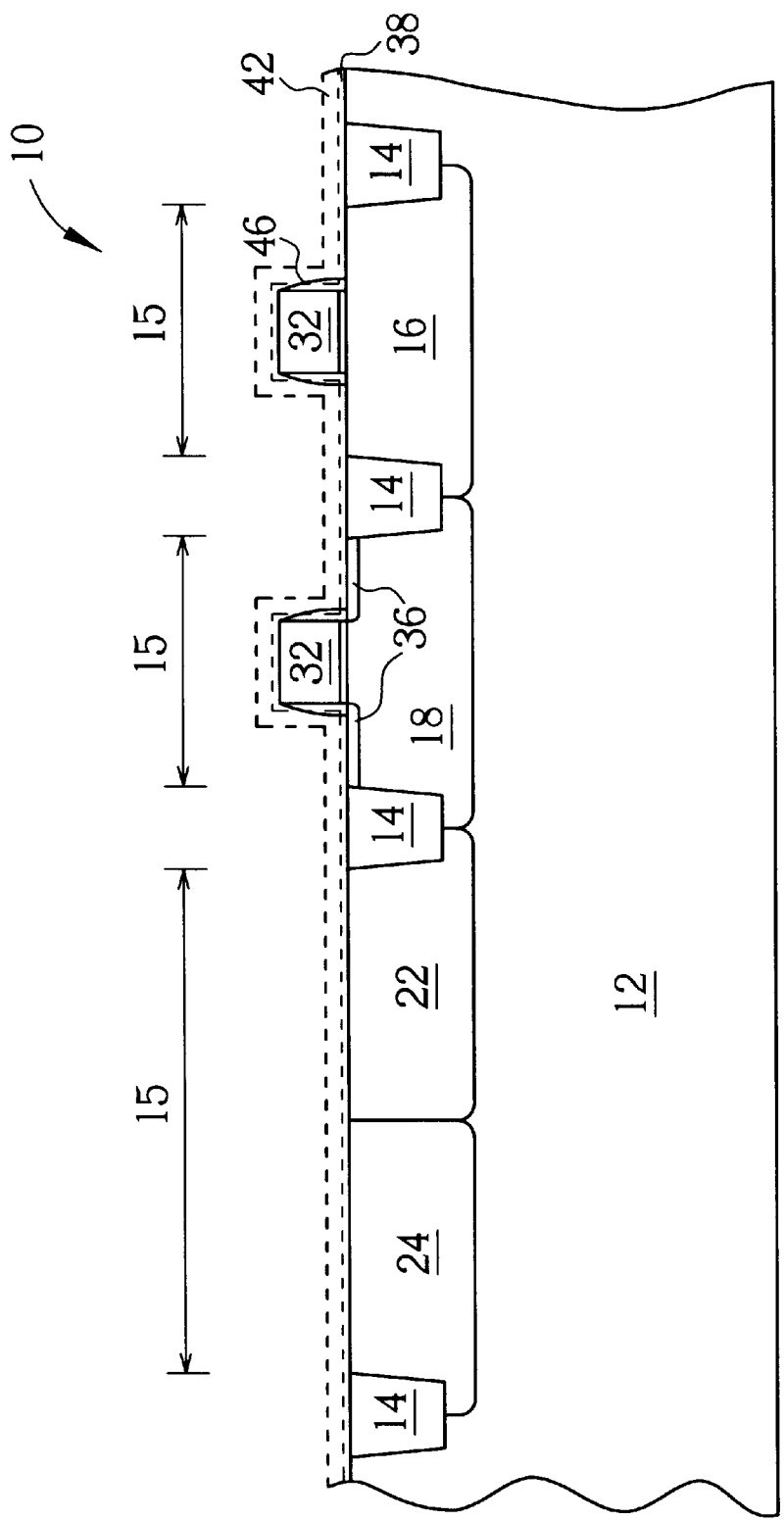
Figure 5:
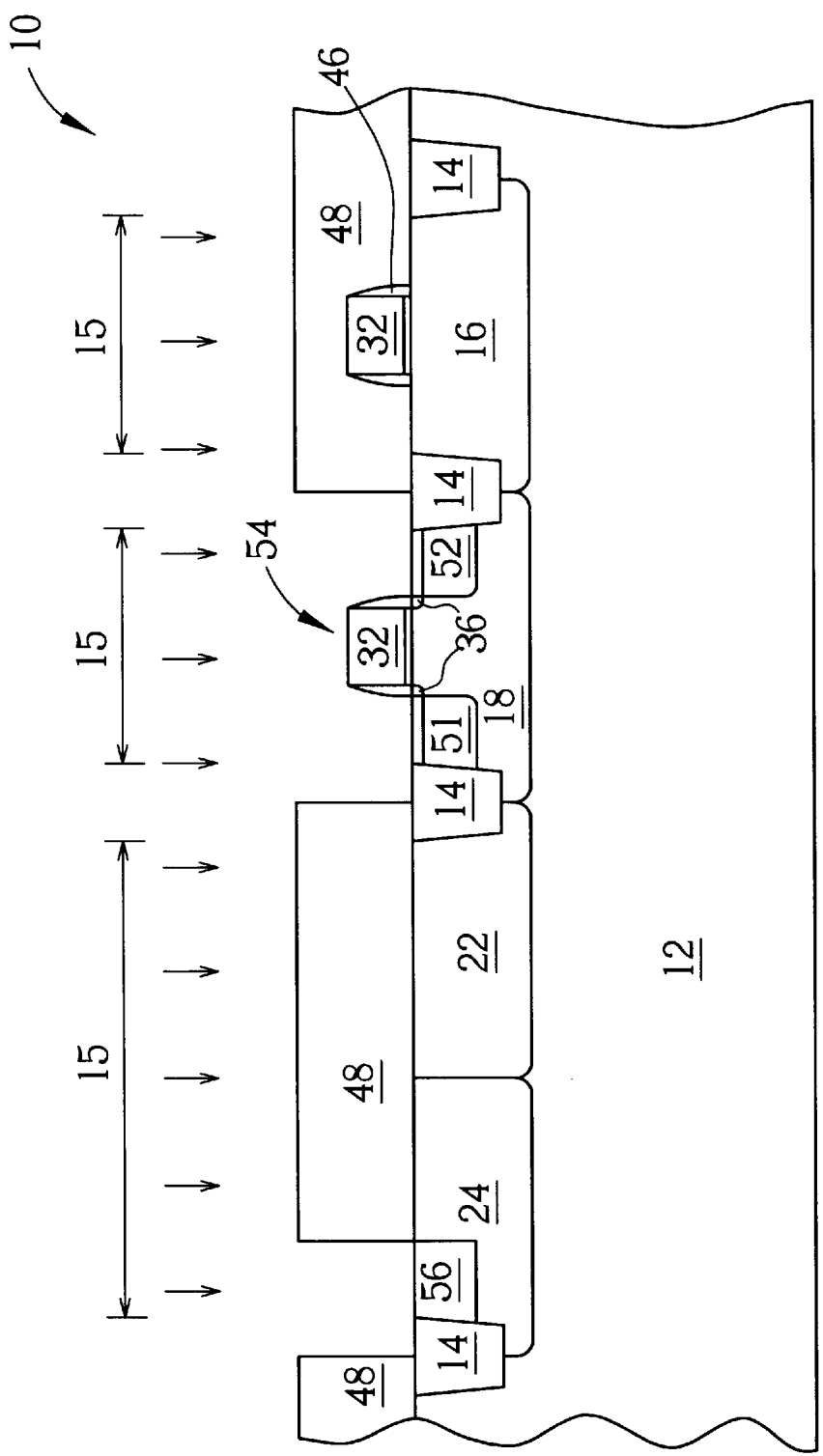
Figure 6:
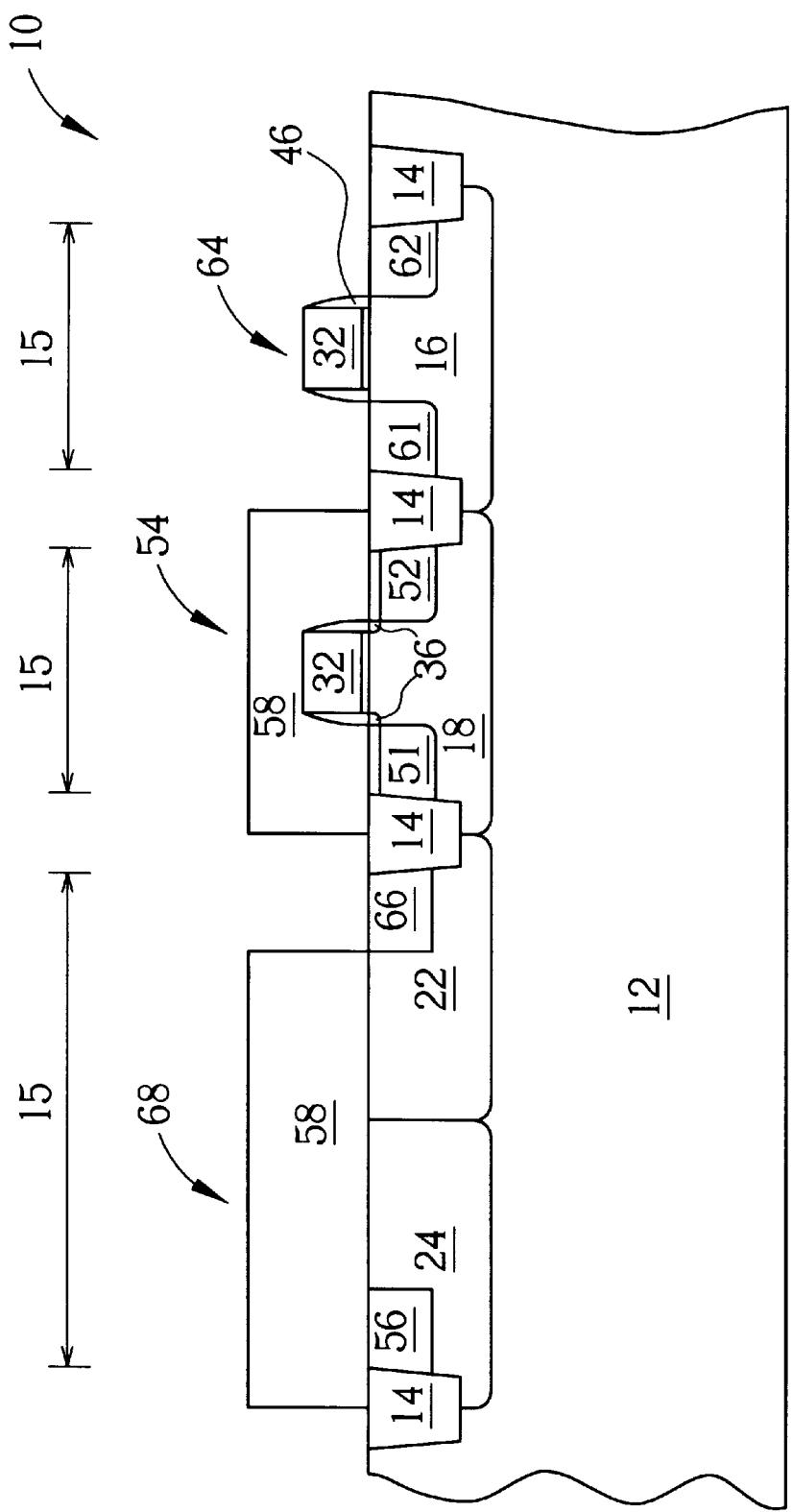
Figure 7:
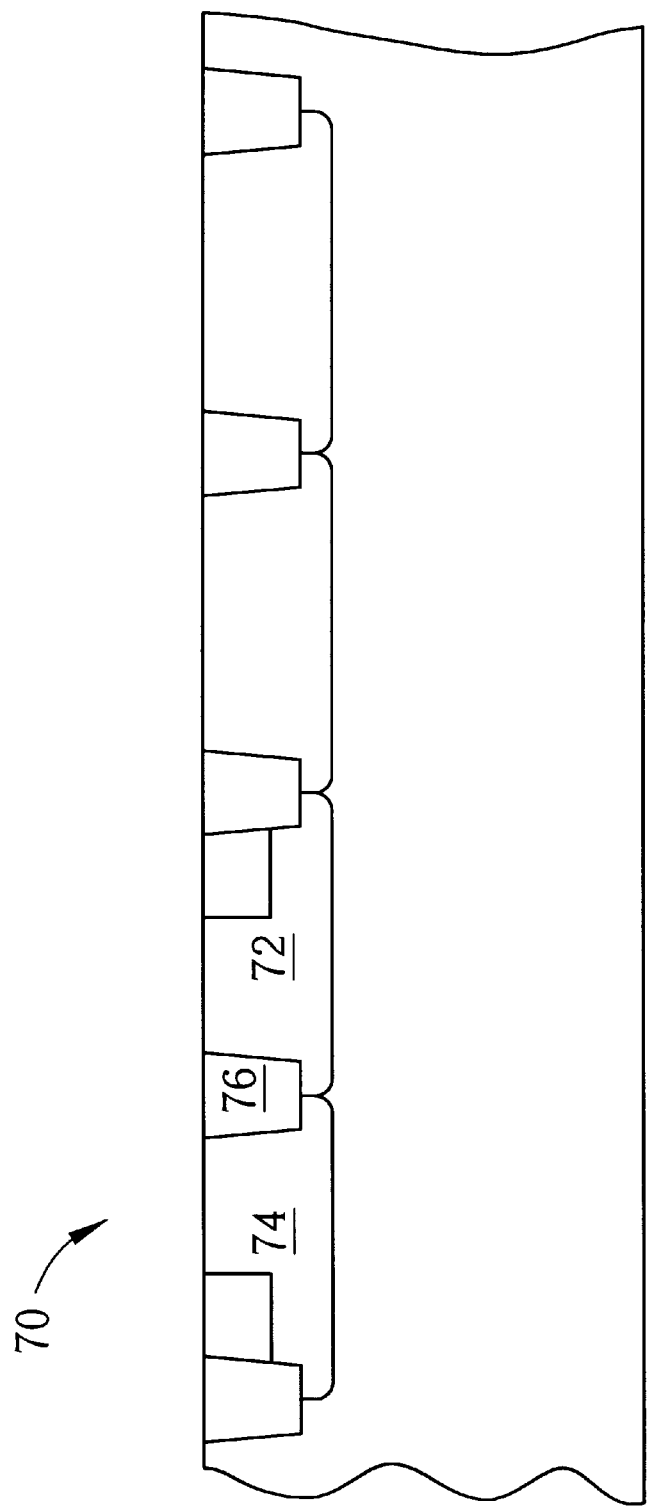
FIG. 7 is the structural schematic diagram of another prior art SCR.
Figure 8:
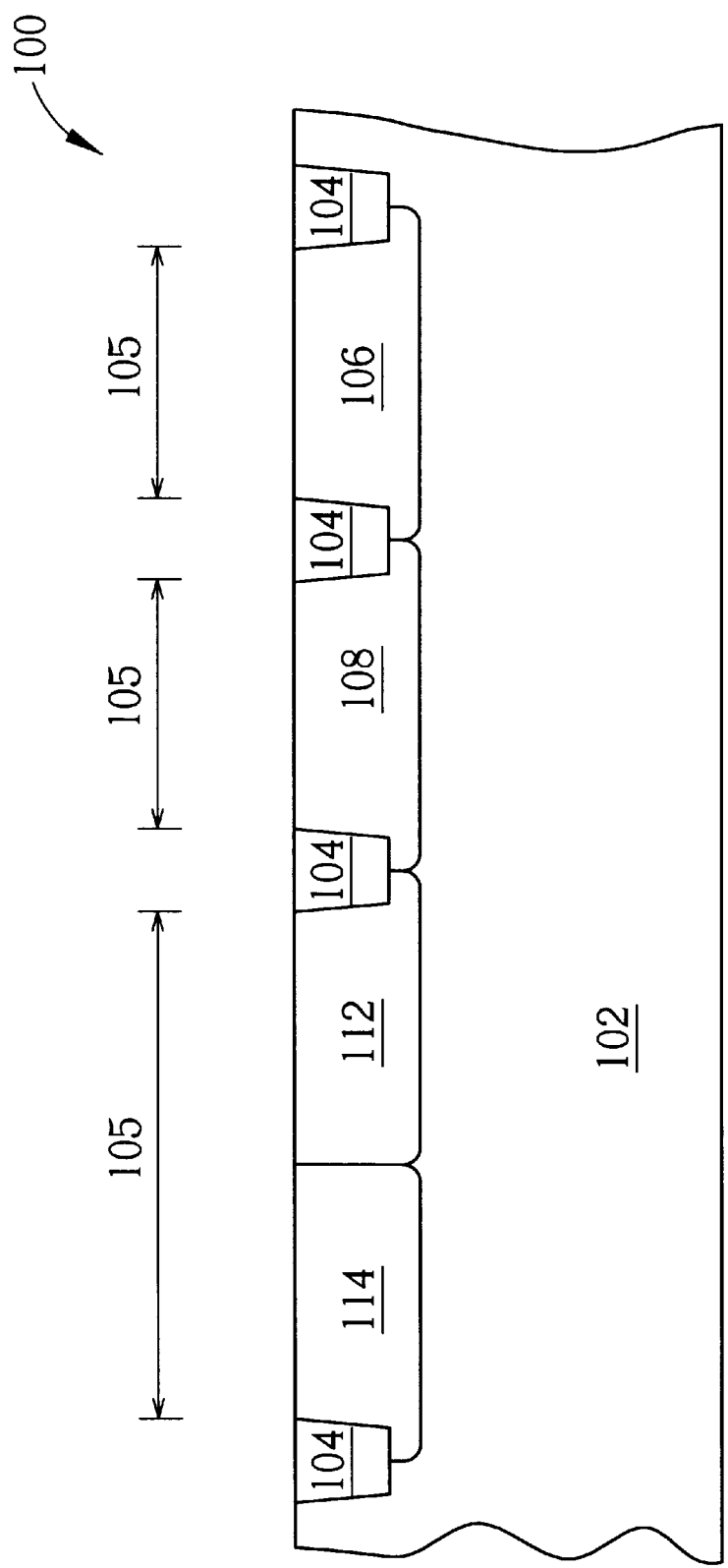
FIG. 8 to FIG. 13 are the cross-sectional diagrams for making the present invention silicon controlled rectifier.

Please refer to FIG. 8 to FIG. 13, FIG. 8 to FIG. 13 are the cross-sectional diagrams for making the present invention silicon controlled rectifier 158. As shown in FIG. 8, the present invention silicon controlled rectifier(SCR) is made on a semiconductor wafer 100. The semiconductor wafer 100 comprises a substrate 102. A plurality of shallow trench isolations(STI) 104 are disposed in the substrate 102 to define the active area 105 for each device. The substrate 102 is a silicon substrate or a silicon-on-insulator (SOI) substrate.

As the semiconductor wafer 100 comprises of other transistor devices, such as NMOS and PMOS transistors with various threshold voltages, an ion implantation process is first performed in the present invention to form an N-well 106 and a P-well 108 for other PMOS transistor(not shown) and NMOS transistor(not shown) respectively.Simultaneously an N-well 12 and a P-well 14, which are adjacent to each other are formed in the substrate 102 of the active area 105 of the SCR device.

Figure 9:
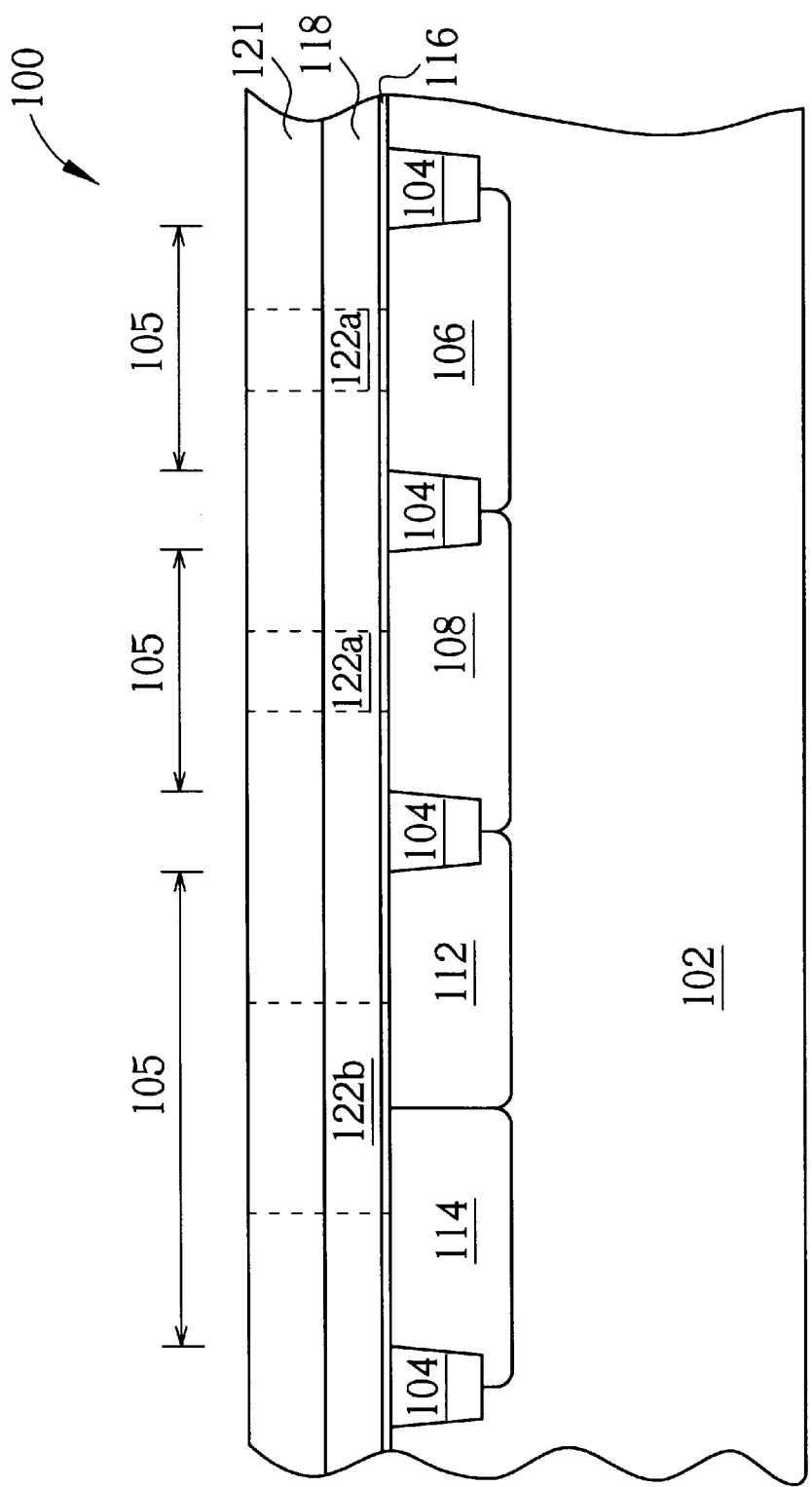

As shown in FIG. 9, a gate oxide layer 116 is first formed on the surface of the semiconductor wafer 100 by either a thermal oxidation or a low pressure chemical vapor deposition (LPCVD) process. Then another low pressure chemical vapor deposition (LPCVD) process is performed to homogeneously deposit a polysilicon layer 118 on the semiconductor wafer 100. The process conditions for LPCVD process utilizes silane ($SiH_4$) as a reactive gas with a temperature ranging from 575 to 650° C., and a pressure ranging from 0.3 to 0.6 torr.

Thereafter a first photoresist layer 121 is formed on the polysilicon layer 118, followed by a photolithography process to define the sites and dimensions of gates 122a for NMOS transistor (not shown) and PMOS transistor (not shown) and a dummy gate 122b in the first photoresist layer 121. After that, a dry etch process is performed to vertically remove the polysilicon layer 118 along the defined pattern down to the gate oxide layer 116 or to the surface of the semiconductor wafer 100. So, the gates 122a for NMOS transistor (not shown) and the PMOS transistor (not shown) are formed and a dummy gate 122b is formed in the active area 105 of the SCR device 158. Finally the first photoresist layer 121 is removed.

Figure 10:
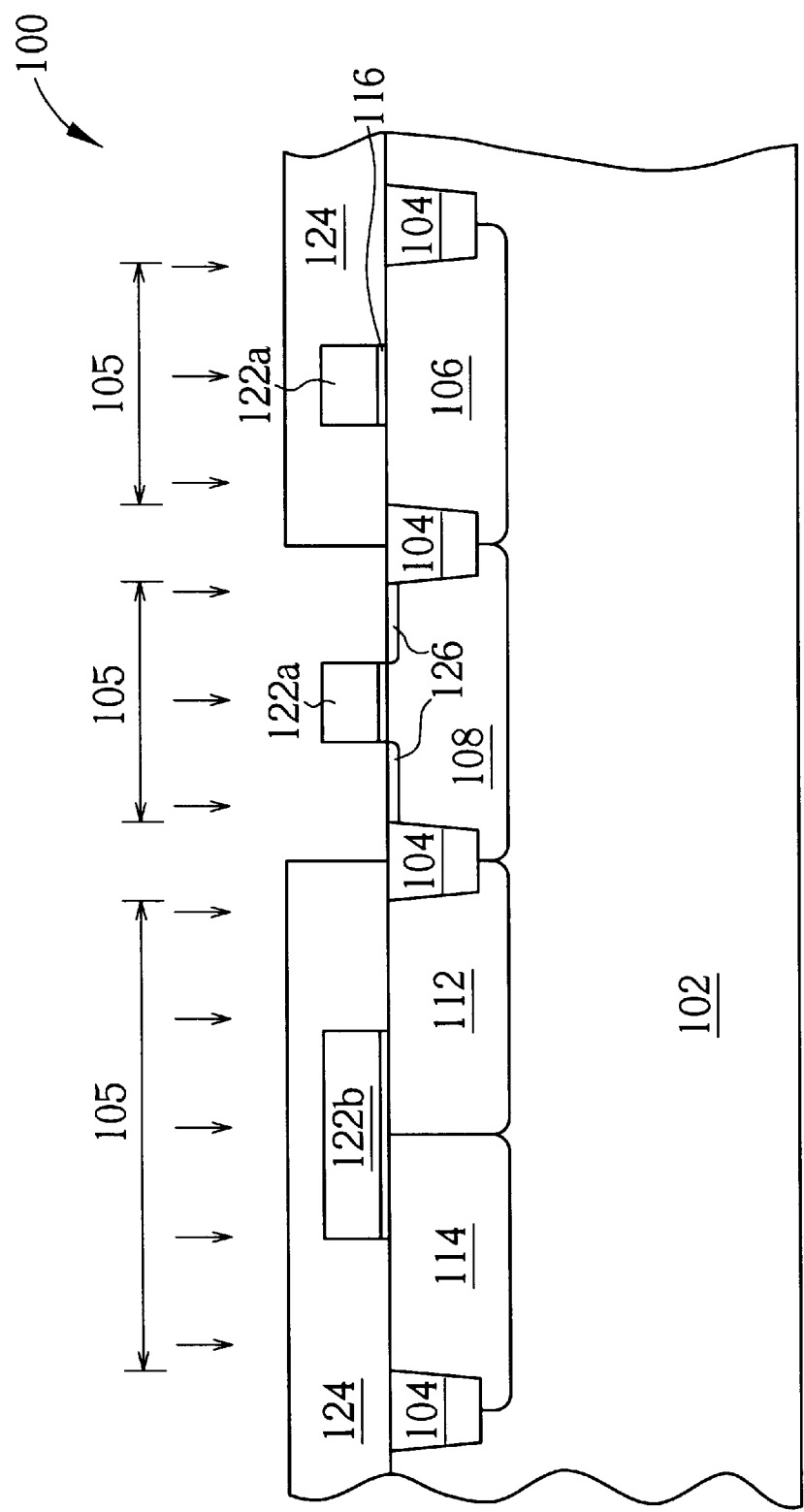

As shown in FIG. 10, a first ion implantation process is performed by utilizing a second photoresist layer 124 and the gates 122a as masks to form a lightly doped drain(LDD) 126 on either side of each gate 122a of NMOS transistor (not shown). Finally the second photoresist layer 124 is removed.

Figure 11:
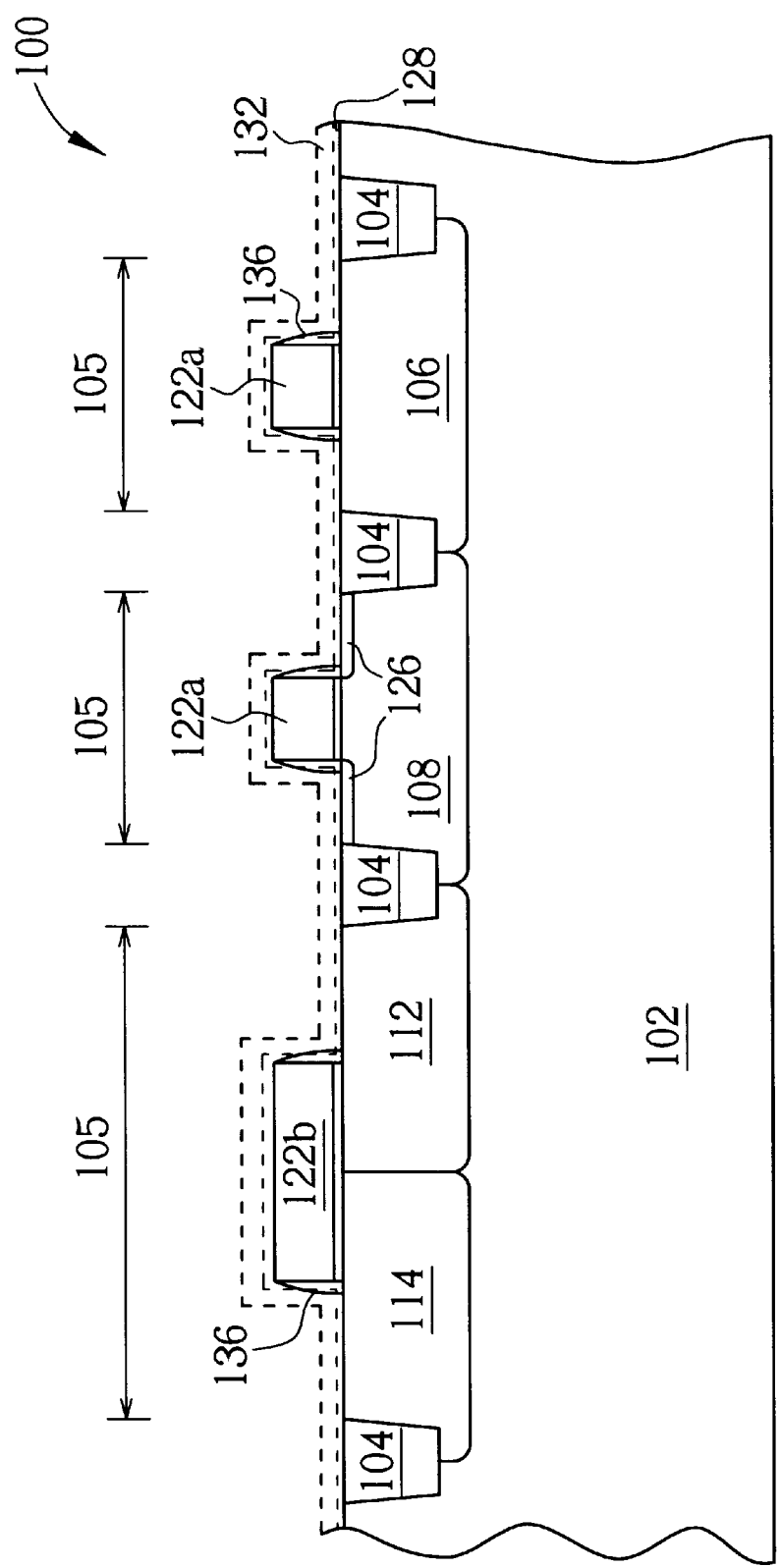

As shown in FIG. 11, a silicon oxide layer 128, employed as a linear oxide layer, is deposited on the surface of the semiconductor wafer 100 by utilizing a chemical vapor deposition(CVD) process. Then a silicon nitride layer 132 is deposited on the silicon oxide layer 128 by a chemical vapor deposition process. Thereafter, a dry etch process is performed to etch the silicon nitride layer 132 downwards by utilizing the silicon oxide layer 128 as an etch stop layer. After that, a dry etch process is performed to etch the silicon oxide layer 128 downwards until the surface of the semiconductor wafer 100 is reached to form a spacer 136 on either side of each gate 122a of NMOS transistor (not shown) and PMOS(not shown) and the dummy gate 122b.

Figure 12:
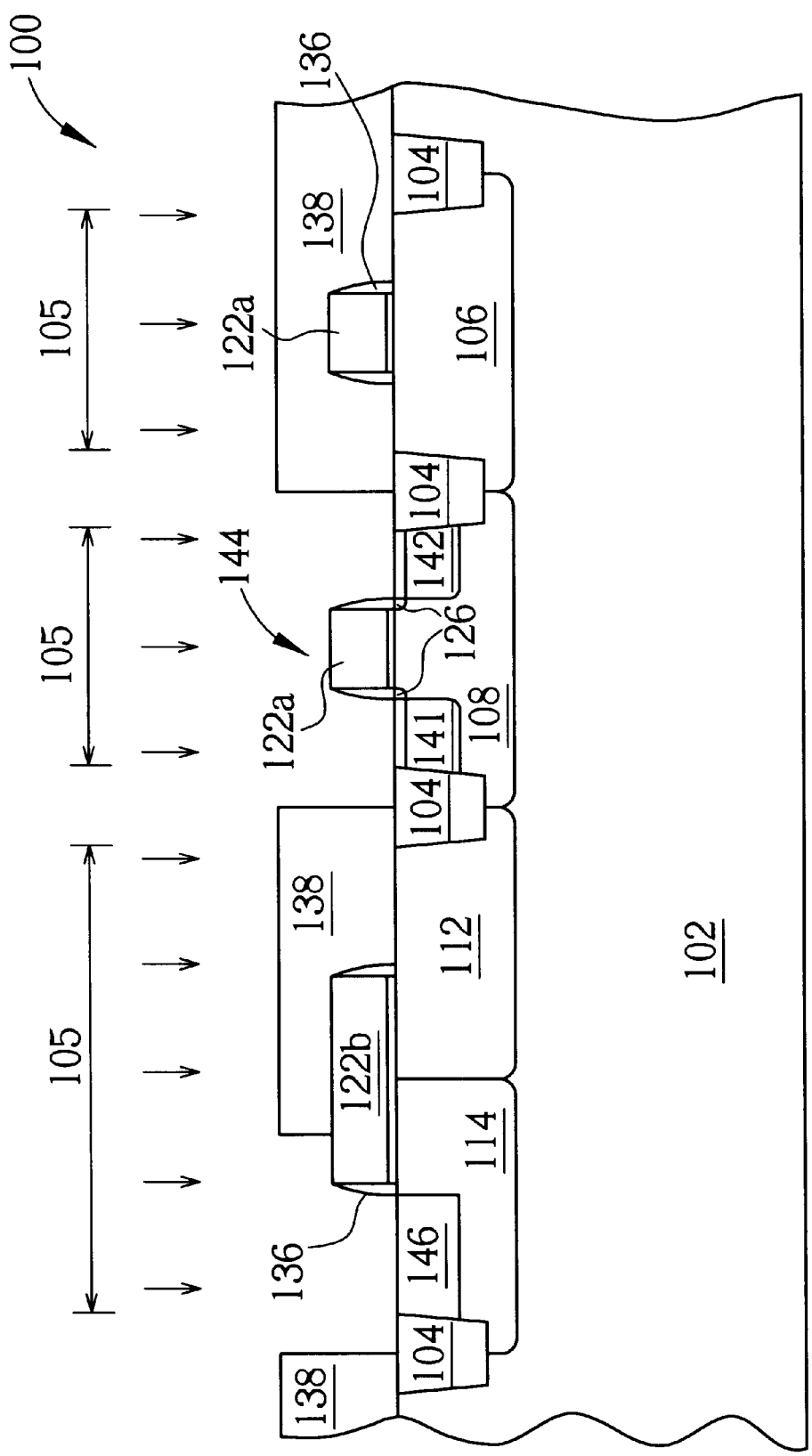

As shown in FIG. 12, a third photoresist layer 138 is formed on the surface of the semiconductor wafer 100. The third photoresist layer 138 covers the PMOS transistor (not shown), the N-well 112, a portion of the neighboring STI 104 and a portion of the P-well 114 in the SCR device. An area in the P-well 14 adjacent to the neighboring STI 104 and the P-well 108 is exposed. An ion implantation process with either phosphorous (P) ions or arsenic (As) ions as a dopant, having a dosage of $10^{15}/cm^2$, is performed to form a source/drain (S/D) 141,142 on either side of the gate 122a of NMOS transistor (not shown) to complete the NMOS transistor 144. The ion implantation process simultaneously forms an N-type heavy doping region 146 in the area of the P-well 114 adjacent to the neighboring STI 104 for use as a cathode of the SCR device 158. Finally the third photoresist layer 138 is removed.

Figure 13:
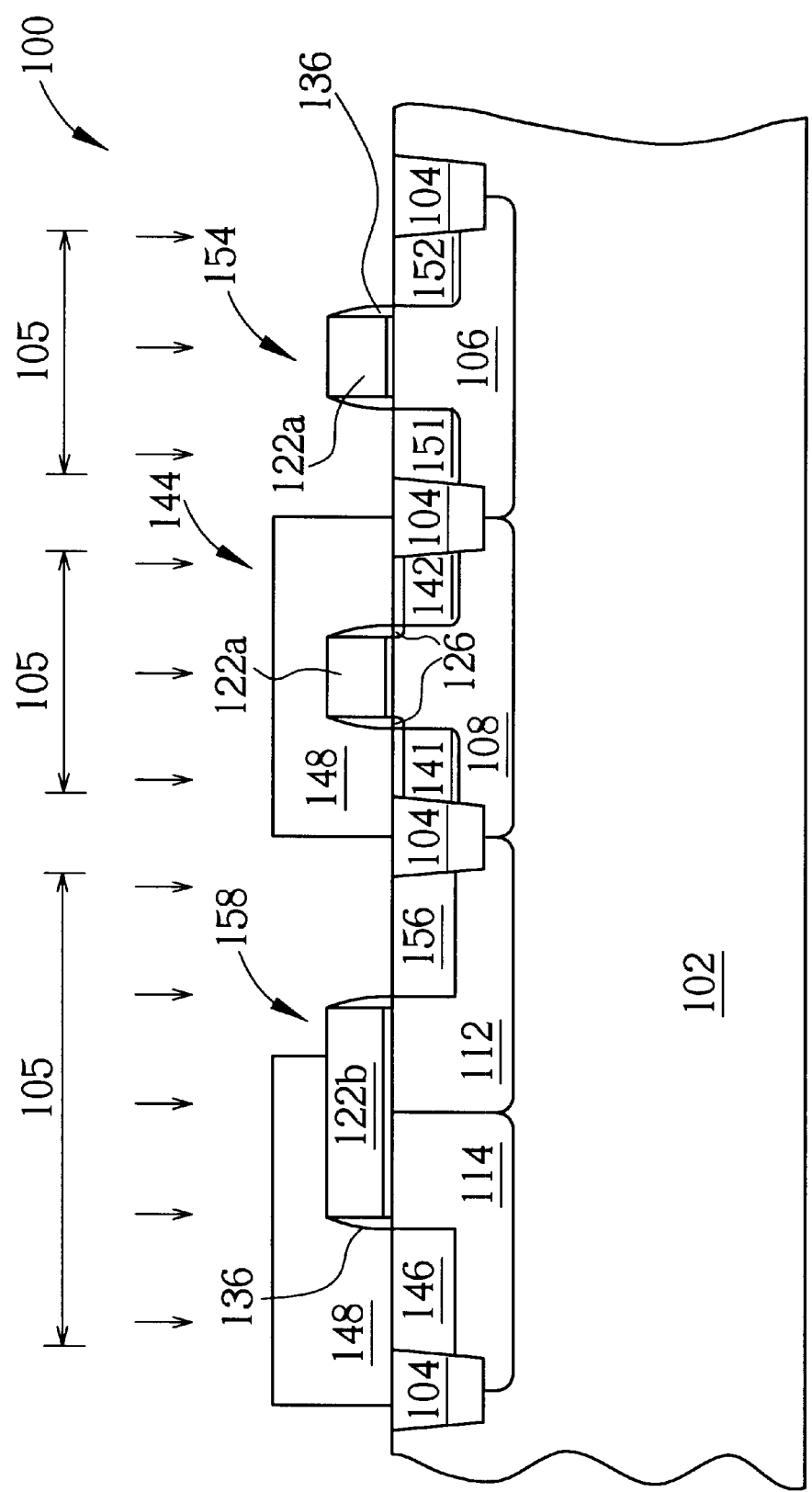
Figure 14:
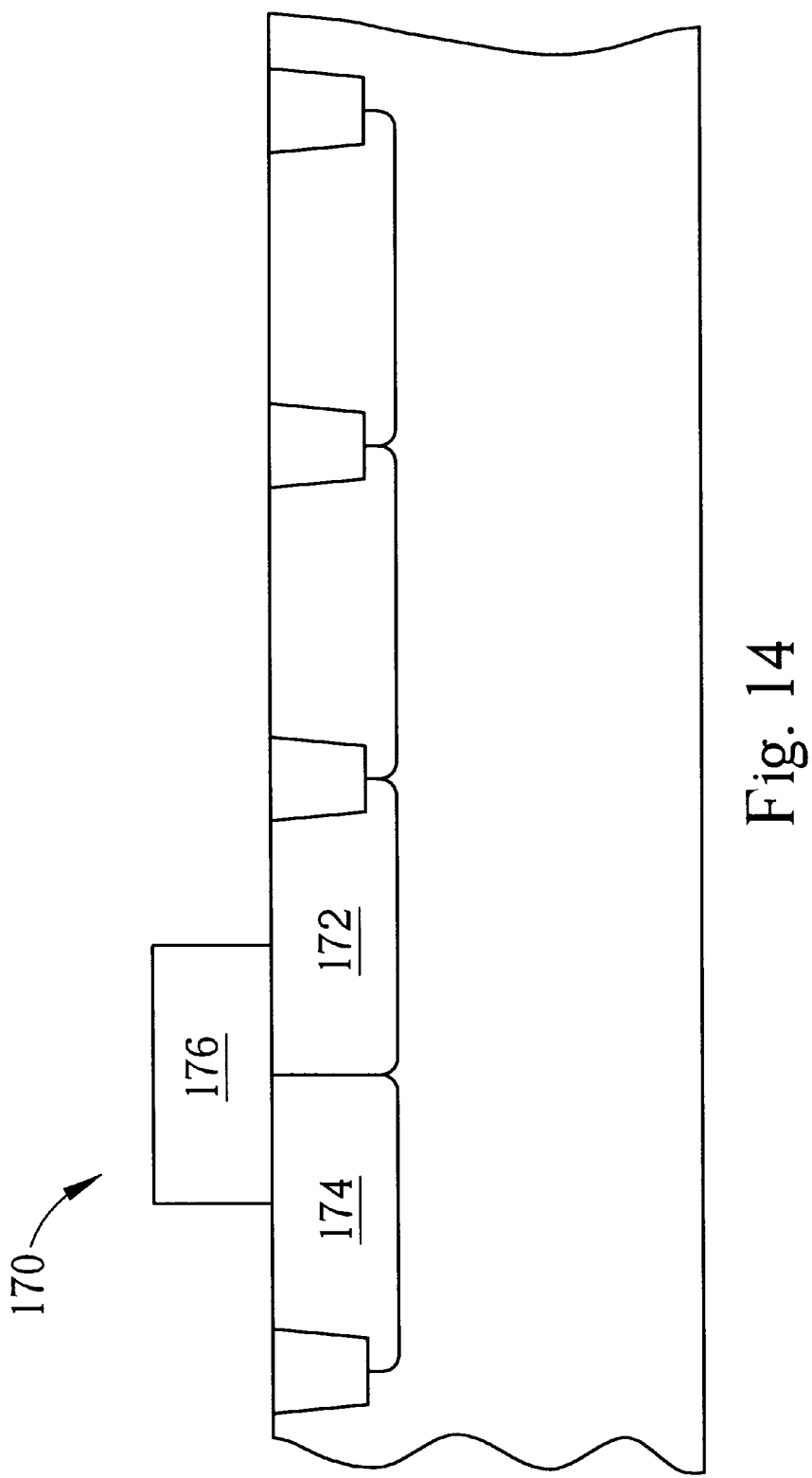
FIG. 14 is the schematic diagram of the SCR device according to the second preferred embodiment of the present invention.

Then as shown in FIG. 13, a fourth photoresist layer 148 is formed on the surface of the semiconductor wafer 100. The fourth photoresist layer 148 covers the NMOS transistor 144, the P-well 114, a portion of the neighboring STI 104 and a portion of the N-well 112 in the SCR device. An area in the N-well 112 adjacent to the neighboring STI 104 and the N-well 106 is exposed. Then an ion implantation process with boron(B) as dopant, having a dosage of $10^{15}/cm^2$, is performed to form a source/drain(S/D) 151,152 on either side of the gate 122a of the PMOS transistor to complete the PMOS transistor 154. The ion implantation process simultaneously forms a P-type heavy doping region 156 in the area of the N-well 112 adjacent to the neighboring STI 104 for use as an anode of the SCR device 158, and completes the SCR device 158. Finally the fourth photoresist layer 148 is removed and a drive-in process is performed to distribute the implanted dopant to desired doping profiles. Please refer to FIG. 14, FIG. 14 is the schematic diagram of the SCR device 170 according to the second preferred embodiment of the present invention. As shown in FIG. 14, the major difference between the second preferred embodiment and the first preferred embodiment shown from FIG. 8 to FIG. 13 according to the present invention is: the dummy gate 122b on the surface of the semiconductor wafer 100 is replaced by an isolator 176. That means a deposition, a photolithography and an etching process are performed after forming the N-well 172 and P-well 174. So an isolator 176 composed of insulating materials, such as silicon nitride, silicon oxide,etc, is formed on the border of the N-well 172 and P-well 174 in the SCR device 170 to replace the dummy gate 122b in the first preferred embodiment of the present invention.

The method for making the present invention SCR device is to form a dummy gate (or an isolator 176 in the second preferred embodiment of the present invention) on the surface of the semiconductor wafer on the border of the N-well and the P-well first, then perform the ion implantation process for lightly doped drain and the process for spacer. Therefore, the wafer surface on the border of the N-well and the P-well in the SCR device is not contaminated by charged particles. The surface of the semiconductor wafer on the border of N-well and P-well is free from charged particles generated from the processes, and the phenomena of increased leakage current and early breakdown is avoided. Even though the P-type heavy doping region and the N-type heavy doping region in the N-well and P-well are possibly contaminated by particles, the leakage current will not become an issue since the charge concentration incurred from particles is much less compared to the charge concentration of these two heavy doping regions. In other respect, the dummy gate between two STI is used for self-alignment for the P-type heavy doping region and the N-type heavy doping region in the active area of the SCR device when performing the photolithography process for the source/drain ion implantation to improve the accuracy of alignment in subsequent ion implantation processes.

In contrast to the prior method of forming the SCR device, the SCR device according to the present invention is to form a dummy gate on the surface of the semiconductor wafer atop the border of the N-well and the P-well first, then to perform the ion implantation process for the formation of a lightly doped drain and the process for spacer. Therefore, the wafer surface on the border of the N-well and the P-well in the SCR device is not contaminated by charged particles due to these process steps. The dummy gate also protects the surface of the semiconductor wafer on the border of the N-well and the P-well from charged particles generated from the destruction nature of the processes, and prevents the phenomena of increased leakage current and early breakdown. Moreover, the dummy gate (or the isolator in the second preferred embodiment) between two STI is used as a self-aligning mask in the active area of the SCR device when performing the photolithography process for the source/drain ion implantation, so the alignment process is more accurate.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a thyristor, the method comprising:

providing a semiconductor substrate, a surface of the semiconductor substrate comprising at least one active area and a shallow trench isolation (STI) structure surrounding the active area;

forming an N-well, and a P-well adjacent to the N-well, in the active area on the surface of the semiconductor-substrate.

forming agate oxide layer and a polysilicon layer in sequence on the semiconductor substrate;

performing a photo-etching-process (PEP) to etch a portion of the polysilicon layer and the gate oxide layer to fore a dummy gate atop a border of the N-well and the P-well.

forming a spacer on either side of the dummy gate;

forming a first patterned photoresist layer exposing the P-well between the shallow trench isolation structure and the dummy gate;

performing a first ion implantation process;

removing the first patterned photoresist layer;

forming a second patterned photoresist layer exposing the N-well between the shallow trench isolation and the dummy gate;

performing a second ion implantation process; and removing the second patterned photoresist layer;

wherein the dummy gate is used to avoid the surface of the semiconductor substrate atop the border of the N-well and the P-well from being affected by a subsequent process so as to prevent unwanted leakage current and a breakdown decrease of the thyristor.

2. The method of claim 1 wherein the surface of the semiconductor substrate further comprises at least two active areas, an NMOS transistor and a PMOS transistor are respectively formed in the active areas.

3. The method of claim 2 wherein the photo-etching-process (PEP) for forming the dummy gate simultaneously forms a gate for the NMOS transistor and a gate for the PMOS transistor.

4. The method of claim 2 wherein the first ion implantation process is an N-type ion implantation process, the first ion implantation process forms a first high concentration doping region in the F-well between the shallow trench isolation structure and the dummy gate, the first high concentration doping region is-used as a cathode of the thyristor, and the first ion implantation process also forms a source and a drain of the NMOS transistor.

5. The method of claim 2 wherein the second ion implantation process is a P-type ion implantation process, the second ion implantation process forms a second high concentration doping region in the N-well between the shallow trench isolation and the dummy gate, the second high concentration doping region is used as an anode of the thyristor and the second ion implantation process also forms a source and a drain of the PMOS transistor.

6. The method of claim 1 wherein the N-well and the P-well are both low concentration doping regions.

7. The method of claim 2 wherein a third ion implantation process to form a lightly doped drain (LDD) of the NMOS transistor, and a cleaning process, are performed after forming the dummy gate and before forming the spacer.

8. The method of claim 1 wherein the method for forming the spacer comprises:

performing a chemical vapor deposition (CVD) process to form a silicon oxide layer on the surface of the semiconductor substrate for use as a linear oxide layer;

performing a chemical vapor deposition process to form a silicon nitride layer on the surface of the semiconductor substrate; and performing a dry etching process to etch the silicon nitride layer and the silicon oxide layer downward until reaching the surface of the N-well and the P-well.

9. The method of claim 1 wherein the dummy gate is used as a self-aligned mask in the first ion implantation process and the second ion implantation process.

10. A method for forming a thyristor, the method comprising:

providing a semiconductor substrate, a surface of he semiconductor substrate comprising at least one active area and a shallow trench isolation (STI) structure surrounding the active area;

forming a first well of a first conductive type in the active area on the surface of the semiconductor substrate;

forming a second well of a second conductive type adjacent to the first well in the active area on the surface of the semiconductor substrate;

forming an isolator atop a border of the first well and the second well;

forming a first high concentration doping region of a second conductive type in the first well between the shallow trench isolation structure and the isolator; and forming a second high concentration doping region of a first conductive type in the second well between the shallow trench isolation structure and the isolator;

wherein the isolator is used to avoid the surface of the semiconductor substrate atop the border of the first well land the second well from being affected by a subsequent process so as to inhibit unwanted leakage current and a breakdown decrease of the thyristor.

11. The method of claim 10 wherein the first well is a low concentration doping region.

12. The method of claim 10 wherein the second well is a low concentration doping region.

13. The method of claim 10 wherein the isolator comprises silicon oxide or silicon nitride.

14. The method of claim 10 wherein the isolator is a gate oxide layer in a gate structure.

15. The method of claim 10 wherein the surface of the semiconductor substrate further comprises at least two active areas, at least one first conductive type transistor and at least one second conductive type transistor are respectively formed in the active areas.

16. The method of claim 15 wherein the first high concentration doping region and the second high concentration doping region are formed by utilizing a first ion implantation process and a second ion implantation process respectively, the first ion implantation process simultaneously forms a source and a drain of at least one first conductive type transistor on the surface of the semiconductor substrate, the second ion implantation process simultaneously forms a source and a drain of at least one second conductive type transistor on the surface of the semiconductor substrate.

17. The method of claim 16 wherein the first conductive type is a P-type conductive type, and the second conductive type is an N-type conductive type.

18. The method of claim 16 wherein the first conductive type is an N-type conductive type, and the second conductive type is a P-type conductive type.

19. The method of claim 16 wherein the isolator is used as a self-aligned mask in the first ion implantation process and the second ion implantation process.

* * * * *